(12) United States Patent
Bawolek et al.

(10) Patent No.: US 6,459,450 B2
(45) Date of Patent: Oct. 1, 2002

(54) INFRARED FILTERLESS PIXEL STRUCTURE

(75) Inventors: Edward J. Bawolek, Chandler, AZ (US); Kevin M. Connolly, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 09/103,441

(22) Filed: Jun. 24, 1998

(51) Int. Cl.$^7$ .................................................. H04N 3/14
(52) U.S. Cl. ........................ 348/309; 348/311; 348/282
(58) Field of Search ................................ 348/272, 273, 348/282, 308, 311, 309; 359/350; 257/54, 231, 440, 464; 250/226, 214 R

(56) References Cited

U.S. PATENT DOCUMENTS

| | | | |
|---|---|---|---|
| 4,677,289 A | * | 6/1987 | Nozaki et al. ............... 257/440 |
| 4,866,499 A | * | 9/1989 | Aktik .......................... 348/309 |
| 4,965,212 A | | 10/1990 | Aktik |
| 5,144,406 A | * | 9/1992 | Hemings et al. ............ 257/443 |
| 5,449,923 A | * | 9/1995 | Kuo et al. ..................... 257/53 |
| 5,557,133 A | * | 9/1996 | de Cesane et al. .......... 257/440 |
| 5,671,914 A | * | 9/1997 | Kalkhoran ................... 257/440 |
| 5,747,863 A | * | 5/1998 | Shoda .......................... 257/440 |
| 5,805,333 A | * | 9/1998 | Tanaka et al. ............... 359/350 |

OTHER PUBLICATIONS

Patent Cooperation Treaty, International Search Report or Declaration for application No. PCT/US99/14212 dated Oct. 26, 1999 (6 pages).

* cited by examiner

Primary Examiner—Andrew Christensen
Assistant Examiner—Jacqueline Wilson
(74) Attorney, Agent, or Firm—Blakely, Sokoloff, Taylor & Zafman LLP

(57) ABSTRACT

A pixel structure of an image sensor, the pixel structure for providing sensor signals in response to incident light is provided. The pixel structure includes light selective elements, the light selective elements having predetermined thicknesses to absorb only light having wavelengths corresponding to the visible region of the light spectrum.

12 Claims, 5 Drawing Sheets

INFRARED FILTERLESS PIXEL STRUCTURE

BACKGROUND OF THE INVENTION

(1) Field of the Invention

The present invention relates to imaging systems and more specifically to the pixel structure in an imaging system.

(2) Description of the Related Art

Image sensing devices are generally characterized as the light detecting component in imaging systems. An image sensing device in a camera, for example, uses light to capture an image so as to replace traditional film-based systems. The image sensing device in a camera is configured to capture a monochrome or color image by way of charge coupled device (CCD) technology, or field effect transistor (FET), bipolar junction transistors (BJTs), diode devices, or photoresistors fabricated with complementary metal oxide semiconductor (CMOS) devices.

Imaging systems built with CCD or CMOS based image sensors generally require an infrared (IR) filter as part of the optical system. This need arises because the most common semiconductor-based image sensing devices respond not only to visible light (approximately 380 to 780 nanometers), but also to infrared light in the range of approximately 780 to 1100 nanometers. Without an IR filter, it is virtually impossible to obtain a high-quality color image due to the effect of infrared signals which distort the image. Monochrome imagers also require an IR filter to correctly preserve scene luminance.

Conventionally, an IR filter is incorporated into the imaging system and is part of the optical train (i.e., somewhere in the optical system apart from the image sensing device) either overlying the lens or interposed within other optical elements. The disadvantage of the inclusion of a separate IR filter is that it adds costs (IR filters typically cost around $ 0.50 to $ 1.00) and is an additional component to the total system count, i.e., piece-part count. Also, the inclusion of this additional component must be accommodated in the design of the imaging system, thereby adding additional complexity and costs as each IR filter must be mechanically assembled into the imaging system. Moreover, depending on where the IR filter is placed, the size of the imaging system would be changed further adding costs to the imaging system. The system software and signal processing must also be adjusted to accommodate for the color performance characteristics of the IR filter. Additionally, if the IR filter is placed, for example, in front of the lens, the IR filter is exposed to the environment and therefore presents the risk of damage by the environment, such as by moisture or scratching.

Yet another concern with the use of IR filters in imaging systems is that of signal loss. The insertion of IR filters diminishes the overall signal-to-noise ratio of the imaging system as these filters typically pass approximately only 80 to 90% of light in the visible spectrum. Thus, an imaging system with an IR filter, having a lower signal-to-noise ratio, will yield a lower quality image as opposed to an imaging system having a higher signal-to-noise ratio.

It is desirable to provide an imaging system that eliminates the effect of infrared light upon the image sensors and yet does not require the use of an IR filter, thereby eliminating the additional costs and complexities associated with adding an additional component to the overall system.

SUMMARY OF THE INVENTION

A pixel structure for providing sensor signals in response to incident light. The pixel structure includes light selective elements, the light selective elements having predetermined thicknesses to absorb only light having wavelengths corresponding to the visible region of the light spectrum.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

The present invention relates to a pixel structure for an imaging system that does not require the use of an IR filter. In the following description, numerous specific details are set forth in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

As stated in the background of the invention, image sensing devices are the detectors that convert light from photons to electrons in creating the imaged scene from the optical image. Typically, this is an image sensor that is fabricated using complimentary metal oxide semiconductor (CMOS) or charge coupled device (CCD) technologies. The image sensor is made up of a number of pixels, for example, 640 columns by 480 rows of pixels, with each pixel capable of absorbing light. The image sensor captures the optical image by tessellating the incident light into a twodimensional array of the picture. The light energy is then converted into an electrical charge. Depending on the architecture of the image sensor, these pixels are "addressed" to read the converted charge out of the image sensor. Some image sensors use a diode as the photosensitive element in the image sensor. Typically, these diodes are integrated into the CMOS circuitry or can be made on top of the CMOS circuitry by conventional deposition techniques.

It should be noted that, the process steps and structures described below do not form a complete process flow for manufacturing imaging systems. The present invention can be practiced in conjunction with techniques currently used in the art, and only so much of the commonly practiced process steps are included to allow an understanding of the present invention.

Figure 1:
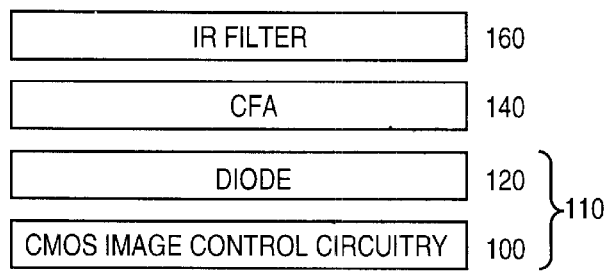
FIG. 1 shows a block diagram of the components of a conventional digital imaging system found in a digital camera.

FIG. 1 shows a block diagram of the components of a typical imaging system found in a digital camera. The sensor 110 includes a diode 120 and CMOS image control circuitry 100. Diode 120 is typically fabricated on top of the CMOS image control circuitry 100. Overlaid on diode 120 is a color filter array (CFA) 140. In general, CFA 140 is made of three or more color channels that each selectively pass through different portions of the spectrum of visible light and therefore limit the light that is incident on diode 120. Without a light selective element or IR filter 160, CFA 140 will pass not only visible light but also infrared light to diode 120. The color filter channels of CFA 140 selectively allow light corresponding to a predetermined range of the visible spectrum to pass through a channel to diode 120. Thus, CFA 140 allows light having the color content of the imaged scene to be estimated by appropriate operation of the device on the responses of the camera colored channels. Commonly used color schemes include red-green-blue (RGB), cyan-magenta-yellow (CMY), and cyan-magenta-yellow-green (CMYG). An RGB system, for example, divides the range of the light spectrum visible to a human eye (approximately 400–700 nanometers), into three colors based on their wavelengths. Each Red, Green, or Blue filter passes about one-third of the available visible light through its color channel. Therefore, each color channel ignores two-thirds of the photons from the available light for an imaged scene.

Figure 2:
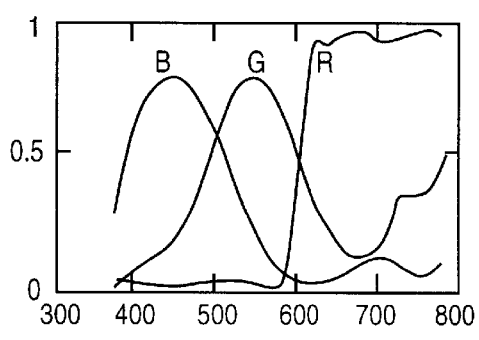
FIG. 2 shows the transmittance characteristics of a conventional red-green-blue (RGB) color filter array (CFA) material.

FIG. 2 presents the transmittance characteristics of a conventional RGB CFA. A transmissivity of 1 denotes total transmission of light while a transmissivity of 0 denotes zero transmission of light. As noted above, the Red, Green, and Blue filter materials have different transmittance characteristics between them that span the visible spectrum, i.e., approximately 400–700 nanometers. The graph shows a Red CFA material (R) having a peak transmissivity at about 600 nanometers, i.e., the Red CFA material (R) passes through approximately 90% of the light having a wavelength above 600 nm; a Green CFA material (G) having a peak transmissivity at about 550 nanometers, i.e., the Green CFA material (G) passes through approximately 75% of the light having a wavelength at about 550 nm, and a Blue CFA material (B) having a peak transmissivity at about 450 nanometers, i.e., the Blue CFA material (B) passes through approximately 75% of the light having a wavelength at about 450 nm.

Figure 3:
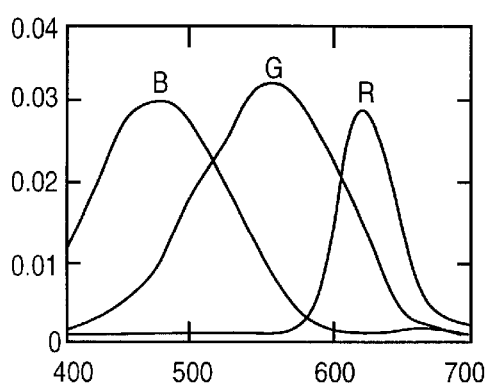
FIG. 3 shows the relative response characteristics of a camera system based on a conventional RGB CFA material that includes an IR filter and typical sensor response characteristics.

FIG. 3 presents the response characteristics of a camera system based on a conventional RGB CFA material that includes an IR filter and typical sensor response characteristics. While FIG. 2 considered the color channel based on the filter material in isolation, FIG. 3 looks at the color channel in terms of the camera system as a whole. FIG. 3 shows the relative response characteristics of the three camera color channels after combining the characteristics of the CPA material with the sensor responsivity and the characteristics of an infrared filter designed to cut-off wavelengths longer than approximately 700 nanometers. The values shown are arbitrary units.

Figures 4, 5:
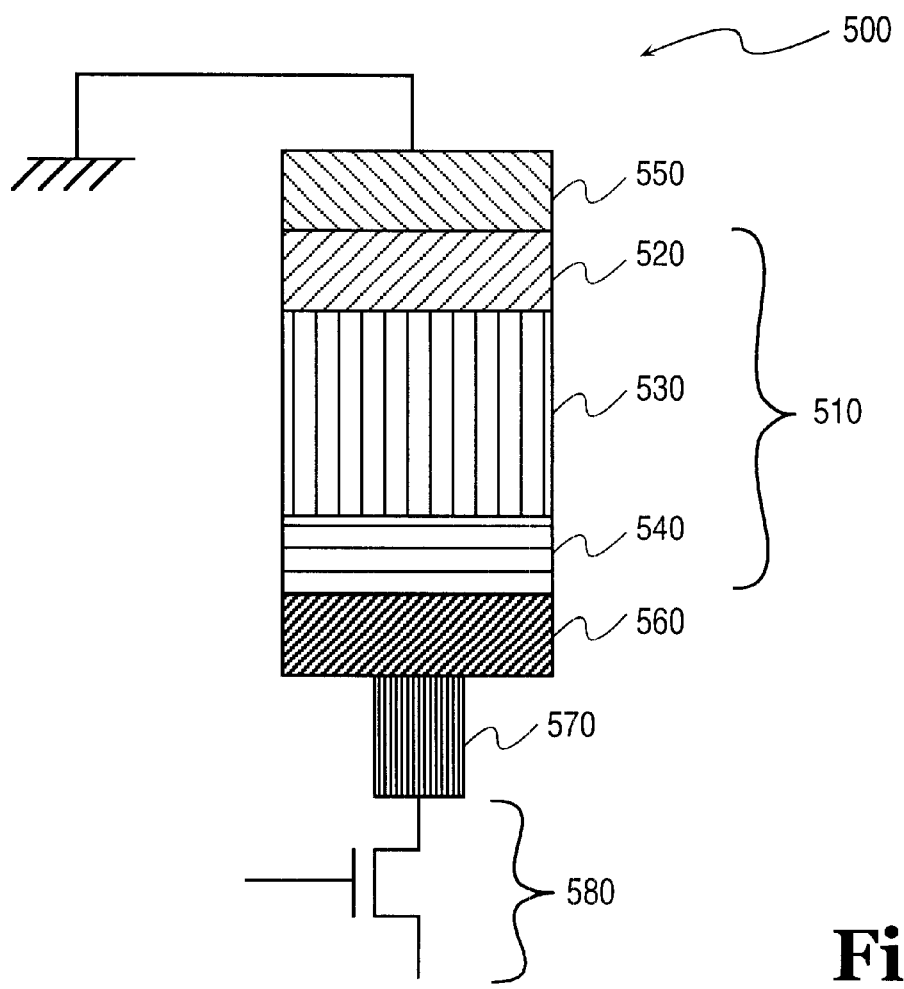
FIG. 4 shows a block diagram of the components of an imaging system according to one embodiment of the present invention.
FIG. 5 shows the pixel structure of an image sensing device according to one embodiment of the present invention.

As stated in the background of the invention, an advantage of the design of the image sensing device of the present invention is that it reduces the piece-part count of the total camera system, since the IR filter element is not required. FIG. 4 shows a block diagram according to one embodiment of the present invention of the components of the imaging system of FIG. 1, including CMOS image control circuitry 400, diode 420, and CFA 440, but without the IR filter. As noted above, the disadvantages of the inclusion of an IR filter include adding costs and complexity to the imaging system.

As it is desirable to provide for an imaging system that captures visible light but limits IR light from entering the image sensors and yet produces high quality images, the present invention accomplishes this without requiring the use of an IR filter. By employing layers of a pixel structure having unique light absorption characteristics and tuning these layers to predetermined thicknesses, the pixel structure of the present invention passes through or reflects off IR wavelengths while the desired wavelengths in the visible spectrum are absorbed in diode 420.

FIG. 5 shows a pixel structure 500 of an image sensing device in accordance with one embodiment of the present invention. Pixel structure 500, comprising a diode 510, a top conductive layer 550, and a bottom conductive layer 560 is created above a CMOS image control circuitry 580. Diode 510 may be any photo sensing element and may be made from amorphous silicon and cadmium telluride, for example. Diode 510 is formed on top of CMOS image control circuitry 580 by conventional deposition processes, such as plasma enhanced chemical vapor deposition (PECVD). It is important that the deposition temperature not exceed the thermal allowance of CMOS image control circuitry 580. Otherwise, the structure of CMOS image control circuitry 580 may be destroyed.

In one embodiment of the present invention, diode 510 is a standard amorphous silicon pin diode and is formed by a thin layer 520 of p-type hydrogenated amorphous silicon (a-Si:H) followed by a thick layer 530 of intrinsic a-Si:H and a thin n-type layer 540 of a-Si:H. Intrinsic layer 530 absorbs the incident photons and converts them to electron hole pairs. Intrinsic layer 530 may have a thickness in the range of 0.1 $\mu$m to 1 $\mu$m. In one embodiment of the present invention, intrinsic layer 530 has a thickness of 0.23 $\mu$m in order to collect all of the incident photons. P-type layer 520 and n-type layer 540 are made thin enough so that the bias can be created across intrinsic layer 530. P-type layer 520 and n-type layer 540 may have thicknesses in the range of 5 nm to 20 nm and 5 nm to 40 nm, respectively. In one embodiment of the present invention, p-type layer 520 and n-type layer 540 have thicknesses of 10 nm and 20 nm, respectively. Since p-type layer 520 has a high sheet resistance, a first conductor material 550 having a low sheet resistance would be necessary to act as the top contact to ground. Because first conductor material 550 is formed above diode 510, first conductor material 550 must be transparent to allow light to diode 510 and first conductor material 550 must also be conductive in order to ground p-type layer 520. The conductor material could be zinc oxide or tin oxide, for example. In one embodiment of the present invention, first conductive layer 550 comprises indium tin oxide (ITO). First conductive layer 550 has a thickness in the range of 50 to 200 nm and may be formed on top of p-type layer 520 by conventional deposition or sputtering techniques, for example. N-type layer 540 is then contacted with second conductive layer 560 comprising a metal conductor, such as titanium (Ti) or chromium (Cr) which connects to CMOS image control circuitry 580. Via 570 may be formed by conventional processes and filled with conducting materials such as aluminum (Al) or copper (Cu) and is made to contact CMOS image control circuitry 580.

Figure 6:
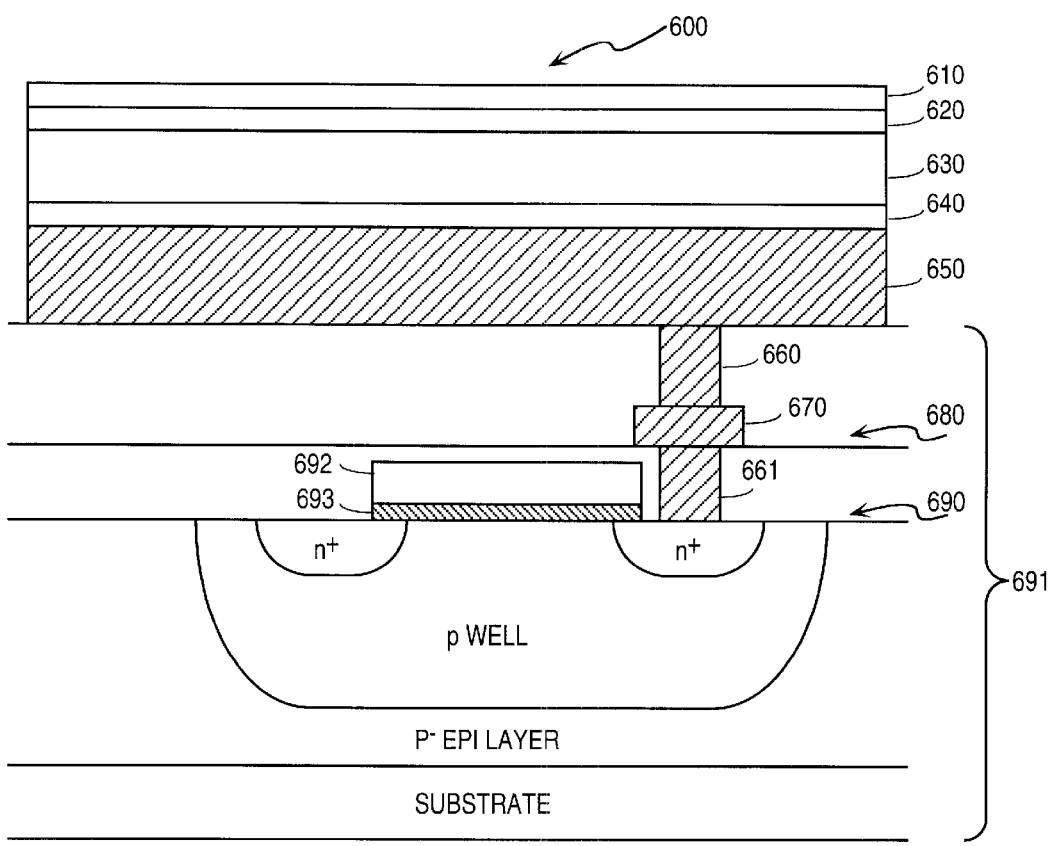
FIG. 6 shows a detailed cross-sectional view of the pixel structure of FIG. 5 formed on a CMOS pixel control circuitry.

FIG. 6 shows a detailed cross-sectional view of the pixel structure of FIG. 5 formed on a CMOS image control circuitry in accordance with one embodiment of the present invention. Pixel structure 600 comprises ITO layer 610, p-type a-Si:H layer 620, intrinsic a-Si:H layer 630, n-type a-Si:H layer 640, and conductive layer 650. Pixel structure 600 is formed above CMOS image control circuitry 691 and connected thereto by via 660 filled with a metal 670. Metal 670 then contacts with a contact 661. Interlayer dielectrics (ILDs) 680 and 690 are formed above CMOS image control circuitry 691 to isolate conductive layer 650 and metal 670. In one embodiment of the present invention, CMOS image control circuitry 691 comprises a polysilicon gate 692 formed above a gate oxide 693. The source and drain of CMOS image control circuitry 691 are N-type formed in a P well.

The pixel structure of the present invention not only captures color images, but by having characteristics built into the pixel structure, also passes IR light. Therefore, the present invention obviates the need for a separate IR filter in an imaging system. This is accomplished by tuning the thicknesses of amorphous silicon pin diode 510 (partitioned into p-type layer 520, intrinsic layer 530, and n-type layer 540) and ITO conductive layer 550 so that the range of light corresponding to the infrared region will pass through or reflect off of pixel structure 500 while the desired wavelengths in the visible spectrum are absorbed.

For instance, if it is desirable to absorb only blue light in the visible spectrum, the thickness of diode 510 and ITO conductive layer 550 may be tailored to predetermined thicknesses such that only light having a peak absorption at about 450 nanometers, corresponding to blue light, will be absorbed. Longer wavelengths of light such as that corresponding to green, red, and infrared will not be absorbed but will pass through or reflect off of the pixel structure. Similarly, if it is desirable to absorb blue and longer wavelengths green light in the visible spectrum, the thicknesses of diode 510 and ITO conductive layer 550 may be further increased to predetermined thicknesses such that only light having a peak absorption from approximately 450 to 550 nanometers, corresponding to blue and green light, will be absorbed. Wavelengths of light longer than blue and green light such as those corresponding to red and infrared will not be absorbed but will pass through or reflect off of the pixel structure. Still further, if it is desirable to absorb blue, green, and longer wavelengths red light, then diode 510 and ITO conductive layer 550 can be made thicker to also absorb light up to the red wavelength having a peak absorption from approximately 450 to 600 nanometers. Wavelengths of light longer than red light such as that corresponding to infrared light will not be absorbed but will pass right through or reflect off of the pixel structure.

Thus, by employing layers of a pixel structure having unique light absorption characteristics and tuning these layers to predetermined thicknesses, the present invention absorbs the desired wavelengths in the visible spectrum (blue, green, and red) but the wavelengths of light at the red-infrared junction are cut off. The pixel structure of the present invention effectively prevents infrared light from entering the imaging sensor, thereby obviating the need for an IR filter.

The absorption characteristics of the pixel structure of the present invention can be demonstrated through simulations. In simulations, it has been shown that the absorption characteristics vary as a function of the possible layer characteristics of the pixel structure and the varying layer thicknesses.

Table 1 below shows the cutoff wavelengths of light (defined as an absorption level equal to 50% of the peak absorption) as a function of the ITO and a-Si:H diode thicknesses generated by simulations. It is believed that only a negligible amount of light is absorbed above the cutoff wavelengths.

TABLE 1

| ITO Thickness (Å) | a-Si:H Diode Thickness ($\mu$m) | Cut-off wavelength (nm) |
|---|---|---|
| 600 | 0.25 | 748.62 |
| 400 | 0.25 | 733.49 |
| 800 | 0.25 | 758.78 |
| 600 | 0.20 | 735.98 |
| 400 | 0.20 | 721.15 |
| 800 | 0.20 | 745.86 |

Figure 7:
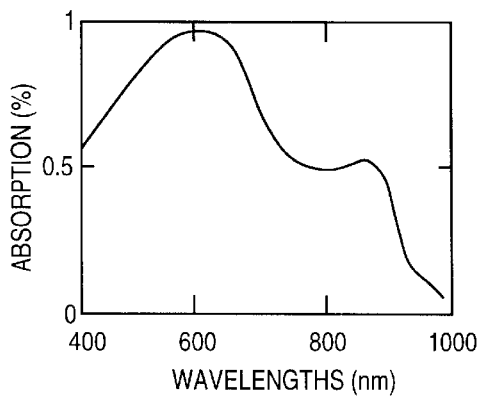
FIG. 7 shows the predicted absorption characteristics of an indium tin oxide (ITO) covered pin diode having an ITO layer of 800 Å and a diode layer of 0.25 $\mu$m.

FIG. 7 shows the absorption characteristics of an ITO covered pin diode where it is desirable to detect IR light in addition to visible light in an imaging system. The ITO covered pin diode has an ITO layer having a thickness of 800 Å and a diode layer having a thickness of 0.25 $\mu$m. When the ITO layer is made 800 Å thick and the amorphous silicon diode layer (partitioned into p-type layer, intrinsic layer, and n-type layer) is made 0.251 $\mu$m thick, simulations have shown that above a 50% absorption rate, light having a peak absorption from approximately 450 to 600 corresponding to blue, green, and red light, respectively, will be absorbed by the ITO covered pin diode. However, light up to around 850 nm, corresponding to a portion of the infrared region (780–1100 nm) will also be absorbed.

Figure 8:
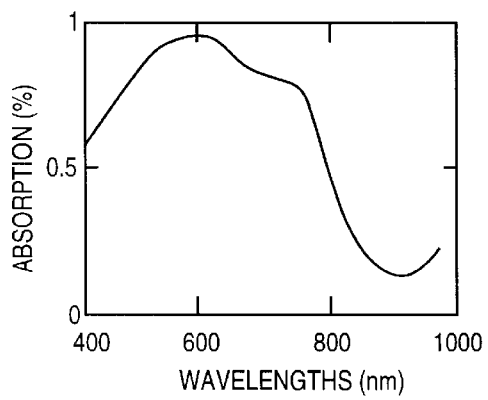
FIG. 8 shows the predicted absorption characteristics of an ITO covered pin diode having an ITO layer of 800 Å and a diode layer of 0.20 $\mu$m according to one embodiment of the present invention.

FIG. 8 shows the absorption characteristics of an ITO covered pin diode where it is desirable to detect visible light but not IR light. In one embodiment of the present invention, the ITO covered pin diode has an ITO layer having a thickness of 800 Å and a diode layer having a thickness of 0.20 $\mu$m. By decreasing the thickness of the amorphous silicon diode layer (partitioned into p-type, intrinsic layer, and n-type layer) from the 0.25 $\mu$m thickness of FIG. 6 to 0.2 $\mu$m and keeping the thickness of the ITO layer at 800 Å, simulations have shown that above a 50% absorption rate, light above approximately 790 nm, corresponding to the infrared region is not absorbed but will pass through the pixel structure or be reflected out. This absorption characteristics of the pixel structure of the present invention shown in FIG. 8 approximates the absorption characteristics of a typical IR filter.

One advantage of the present invention is that any compromise in visible light sensitivity resulting from the tuning process is offset by the increase in signal because an IR filter is not needed. As stated in the background of the invention, the insertion of an IR filter diminishes the overall system's signal-to-noise ratio since the filter typically passes approximately 80–90% of light in the visible spectrum. In the present invention, by eliminating the IR filter component, up to 100%, instead of 80–90% of light in the visible spectrum will pass through yielding a higher quality image than a conventional imaging system requiring an IR filter.

An additional benefit of the present invention is that by not requiring an extra component, a synergistic beneficial effect can be achieved. Since the net image quality of the camera system depends upon the individual components, such as the optics, the IR filter, the color filter array (CFA), as well as the sensor, each of these individual components have built-in tolerances that in the aggregate affect the final image. By eliminating the IR filter component and thus its associated variance, the requirements for calibration or testing associated with that component can be reduced or eliminated.

Figure 9:
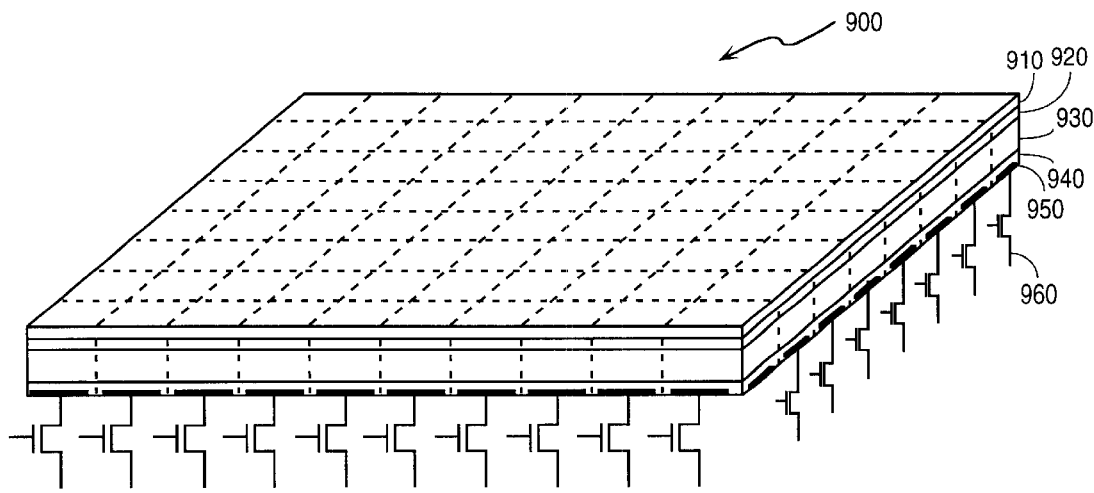
FIG. 9 shows an array of an image sensing device having a plurality of individual pixel structures according to one embodiment of the present invention; and, FIG. 10 shows an imaging system incorporating an array of an image sensing device having a plurality of individual pixel structures according to the present invention.

FIG. 9 shows an array of an image sensing device having a plurality of individual pixel structures according to one embodiment of the present invention. FIG. 9 shows a pixel array 900 comprising ITO layer 910, p-type a-Si:H layer 920, intrinsic a-Si:H layer 930, n-type a-Si:H layer 940, base electrode 950, and image control circuitry 960.

The above discussion focused on the inclusion of an IR selective element or filter for use in an image sensing system, such as a camera. In general, applications of such image sensing devices will seek to filter (e.g., reflect or absorb) IR light in the range of 780–1100 nanometers. It is to be appreciated that the element or filter can be made selective to other wavelengths as warranted by the particular application and that the invention should not be limited to elements selective to a specific spectral range. Instead, the principles set forth herein can be applied to applications involving various selectivity concerns.

Figure 10:
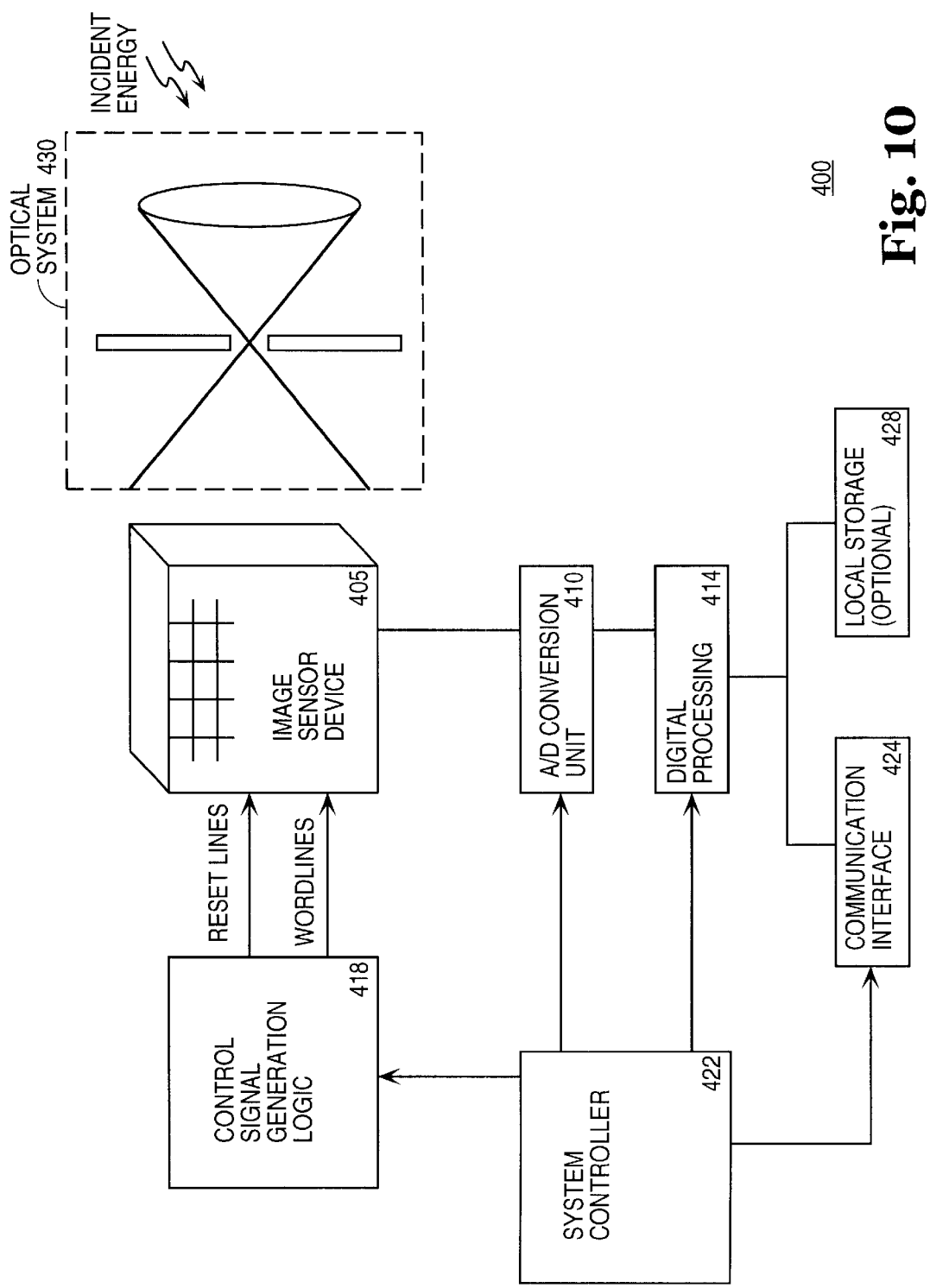

The image sensing device having a plurality of individual pixel structures described above may be used as part of a digital imaging system 400 shown in FIG. 10. Imaging system 400 has an optical system 430 that channels the incident energy being light in this case to create an optical image on image sensing device 405. Control signal generation logic 418 is provided to generate the reset signals and wordlines needed to control photo sensors of image sensing device 405. The output values (sensor signals) may be further processed in analog form before being fed to an analog-to-digital A/D conversion unit 410 that in turn feeds digital processing block 414. Analog signal processing, the A/D unit, and portions of the digital processing block may be located on the same die as the sensor array. The digital processing may include hardwired logic and/or a programmed processor that performs a variety of digital functions, including preparing digital image data based on the sensor signals for storage or transmission.

Transmission of the image data to an external processing system may be accomplished using communication interface 424. For instance, as a digital camera, system 400 will contain a communication interface that implements a computer peripheral bus standard such as universal serial bus (USB) or IEEE 1394-1995. Imaging system 400 may also contain local storage 428 of the non-volatile variety, for instance including a solid state memory such as a removable memory card, a rotating magnetic disk device, or other suitable memory device for permanent storage of digital image data. The operation of system 400 may be orchestrated by a system controller 422 which may include a conventional microcontroller responding to instructions stored as firmware.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising a set of light selective elements having an amorphous silicon diode and an indium tin oxide (ITO) conductive layer of a predetermined thickness to prevent absorption of infrared light.

2. The apparatus of claim 1, wherein said set is tuned to absorb visible light only.

3. The apparatus of claim 1, wherein said diode comprises a hydrogenated amorphous silicon (a-Si:H) pin diode.

4. The apparatus of claim 3, wherein said hydrogenated amorphous silicon (a-Si:H) pin diode has a thickness in the range of 0.02 µm to 1.0 µm.

5. The apparatus of claim 1, wherein said ITO layer has a thickness in the range of 0.08 µm to 0.2 µm.

6. An image sensor system comprising:

a pixel structure for providing sensor signals in response to incident light and control signals, said pixel structure having a set of light selective elements with an amorphous silicon diode and an indium tin oxide (ITO) conductive layer of a predetermined thickness to prevent absorption of infrared light;

an array of filter elements overlying said pixel structure; control circuitry configured to generate said control signals, for controlling said image sensor; and signal processing circuitry for generating image data in response to said sensor signals.

7. The image sensor system of claim 6, wherein said diode comprises a hydrogenated amorphous silicon (a-Si:H) pin diode.

8. The image sensor system of claim 7, wherein said hydrogenated amorphous silicon (a-Si:H) pin diode has a thickness in the range of 0.02 µm to 1.0 µm.

9. The image sensor system of claim 6, wherein said ITO layer has a thickness of 0.08 µm to 0.2 µm.

10. The image sensor system of claim 6, wherein said control circuitry comprises CMOS devices.

11. The image sensor system of claim 6, wherein said control circuitry comprises CCD devices.

12. A method comprising forming an amorphous silicon diode and an indium tin oxide (ITO) conductive layer of a predetermined thickness to at least partially tune said light selective elements to prevent absorption of infrared light.

* * * * *

UNITED STATES PATENT AND TRADEMARK OFFICE
CERTIFICATE OF CORRECTION

PATENT NO.   : 6,459,450 B2
DATED        : October 1, 2002
INVENTOR(S)  : Bawolek et al.

It is certified that error appears in the above-identified patent and that said Letters Patent is hereby corrected as shown below:

Column 6,
Line 32, delete "0.251", insert -- 0.25 --.

Signed and Sealed this

Eighteenth Day of February, 2003

JAMES E. ROGAN
*Director of the United States Patent and Trademark Office*